(12) United States Patent
Jun et al.

(10) Patent No.: US 10,396,133 B2
(45) Date of Patent: Aug. 27, 2019

(54) TWO-WAY ORGANIC LIGHT EMITTING DIODE DISPLAY DEVICE

(71) Applicant: LG Display Co., Ltd., Seoul (KR)

(72) Inventors: Chang-Hwa Jun, Paju-si (KR); Yeon-Suk Kang, Paju-si (KR); Hye-Jin Gong, Paju-si (KR); Jang Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/054,666

(22) Filed: Aug. 3, 2018

(65) Prior Publication Data

US 2019/0189697 A1 Jun. 20, 2019

(30) Foreign Application Priority Data

Dec. 19, 2017 (KR) .......................... 10-2017-0175287

(51) Int. Cl.
| | | |
|---|---|---|
| *H01L 29/08* | (2006.01) | |
| *H01L 27/32* | (2006.01) | |
| *H01L 51/52* | (2006.01) | |
| *H01L 51/50* | (2006.01) | |
| *H01L 27/12* | (2006.01) | |

(52) U.S. Cl.
CPC ........ *H01L 27/322* (2013.01); *H01L 27/1214* (2013.01); *H01L 27/3211* (2013.01); *H01L 51/5036* (2013.01); *H01L 51/5206* (2013.01); *H01L 51/5221* (2013.01); *H01L 51/5237* (2013.01); *H01L 2251/5323* (2013.01)

(58) Field of Classification Search
CPC ............. H01L 27/1214; H01L 27/3211; H01L 51/5036; H01L 51/5206; H01L 51/5211
USPC ............................................... 257/40, 59, 72
See application file for complete search history.

(56) References Cited

U.S. PATENT DOCUMENTS 7,332,860 B2 * 2/2008 Hatwar ............... H01L 27/3213
313/498

* cited by examiner

*Primary Examiner* — Tan N Tran
(74) *Attorney, Agent, or Firm* — Polsinelli PC

(57) ABSTRACT

A two way organic light emitting display device having red, green and blue organic light emitting diodes at corresponding red, green and blue sub-pixels comprises an anode layer disposed at each sub-pixel and each including a first electrode, a first color control layer corresponding to the red sub-pixel and disposed on the first electrode, a second color control layer corresponding to the green sub-pixel and disposed on the first electrode, and a third color control layer corresponding to the blue sub-pixel and disposed on the first electrode, and a second electrode electrically connected to the first electrode and disposed on the first, second and third color control layers, an organic light emitting layer disposed on the anode layer and emitting white light; and a cathode layer disposed on the organic light emitting layer, wherein the white light passes through the first, second and third color layers having different thicknesses and the anode layer and is converted to red, green and blue light in a first direction and passes through the red, green and blue color filters and is converted to red, green and blue light in a second direction, opposite to the first direction.

20 Claims, 4 Drawing Sheets

TWO-WAY ORGANIC LIGHT EMITTING DIODE DISPLAY DEVICE

CROSS REFERENCE TO RELATED APPLICATION

The present application claims the priority benefit of Korean Patent Application No. 10-2017-0175287 filed in Republic of Korea on Dec. 19, 2017, which is hereby incorporated by reference in its entirety for all purposes as if fully set forth herein.

BACKGROUND

Field of the Disclosure

The present disclosure relates to a two-way organic light emitting diode display device (OLED). In particular, the present disclosure relates to a two-way OLED that can improve production efficiency and display a full color image with high brightness and low power consumption.

Discussion of the Background

The advent of the information society draws interest in an information display device processing and displaying a large amount of information and causes to use a portable information device. Accordingly, various flat display devices of lightweight and thin profile have been developed and spotlighted.

For example, the flat display devices include a liquid crystal display device (LCD), a plasma display panel device (PDP), a field emission display device (FED), an electroluminescent display device ELD, and an organic light emitting diode display device (OLED). These flat display devices have advantages of thin profile, lightweight, low power consumption and the like, thus replace a cathode ray tube (CRT) rapidly.

Among the flat display devices, the OLED is a self-luminescent device and can have lightweight and thin profile because the OLED does not require a backlight used for emitting light in the LCD.

Further, compared with the LCD, the OLED has advantages of excellent viewing angle and contrast ratio, low power consumption, operation in low DC voltage, fast response speed, being strong to an external impact because of its solid internal components, and wide operating temperature range.

Particularly, since processes of manufacturing the OLED are simple, production cost of the OLED can be reduced more than that of the LCD.

According to methods of implementing colors, the OLED is categorized into a type of an OLED that uses organic light emitting layers directly emitting red, green and blue lights in respective sub pixels, and a type of an OLED that uses the same organic light emitting layers emitting a white light and red, green and blue color filters in respective sub pixels to realize respective full colors. The type of the OLED using the organic light emitting layers emitting different colors has an disadvantage in manufacturing processes while the type of the OLED using the same organic light emitting layers emitting the white color and the different color filters has an advantage in productivity, brightness, power consumption and the like.

Particularly, going beyond an OLED that uses the white-color organic light emitting layer and the color filters and displays an image in one way (or one direction), effort and research to develop a two-way OLED displaying an image in two ways (or two directions, or opposite directions) have been proceeding actively.

SUMMARY

Accordingly, the present disclosure is directed to a two-way OLED that substantially obviates one or more of the problems due to limitations and disadvantages of the related art.

More specifically, the present disclosure is to provide a two-way OLED that can improve production efficiency and display a full color image with high brightness and low power consumption.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present disclosure, as embodied and broadly described herein, a two-way organic light emitting display device (OLED) includes: a substrate including a red sub pixel, a green sub pixel and a blue sub pixel; a driving thin film transistor in each of the red, green and blue sub pixels; a light emitting diode that is at each of the red, green and blue sub pixels and includes an anode connected to the driving thin film transistor, an organic light emitting layer on the anode and emitting a white light, and a cathode on the organic light emitting layer; an encapsulation substrate that covers the driving thin film transistor and the light emitting diode; and red, green and blue color filters located on the encapsulation substrate corresponding to the red, green and blue sub pixels, respectively, wherein the anode includes: a first electrode; each of first, second and third color control layers located on the first electrode corresponding to each of the red, green and blue sub pixels; and a second electrode located on each of the first to third color control layers, wherein the white light in a first direction penetrates the first electrode to be converted into each of red, green and blue lights at each of the red, green and blue sub pixels, wherein the white light in a second direction penetrates each of the red, green and blue color filters to be converted into each of red, green and blue lights at each of the red, green and blue sub pixels.

In another aspect of the present disclosure, a two way organic light emitting diode display device including first and second sub-pixels defined at an array substrate includes an anode layer disposed at each sub-pixel and electrically connected to each thin film transistor, wherein each anode layer at each sub-pixel includes, a first electrode, a first color control layer corresponding to the first sub-pixel and disposed on the first electrode, a second color control layer corresponding to the second sub-pixel and disposed on the first electrode, a second electrode electrically connected to the first electrode and disposed on the first and second color control layers, wherein the first and second color control layers have different thicknesses; an organic light emitting layer disposed on the anode layer and emitting third color light; a cathode layer disposed on the organic light emitting layer; and first and second color filters corresponding to each of the first and second sub-pixels, wherein the third color light passes through the anode layer and is converted to first and second color light in a first direction and passes through the first and second color filters and is converted to fourth and fifth color light in a second direction, opposite to the first direction.

In a further aspect of the present disclosure, a two way organic light emitting display device having first and second organic light emitting diodes at corresponding first and second sub-pixels includes an anode layer disposed at each sub-pixel and each including a first electrode, a first color control layer corresponding to the first sub-pixel and disposed on the first electrode, a second color control layer corresponding to the second sub-pixel and disposed on the first electrode, and a second electrode electrically connected to the first electrode and disposed on the first and second color control layers, an organic light emitting layer disposed on the anode layer and emitting third color light; and a cathode layer disposed on the organic light emitting layer, wherein the third color light passes through the first and second color control layers each having different thicknesses and the anode layer and is converted to first and second color light in a first direction and concurrently passes through the first and second color filters and is converted to fourth and fifth color light in a second direction, opposite to the first direction.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Reference will now be made in detail to aspects, examples of which are illustrated in the accompanying drawings. The same or like reference numbers may be used throughout the drawings to refer to the same or like parts.

Figure 1:
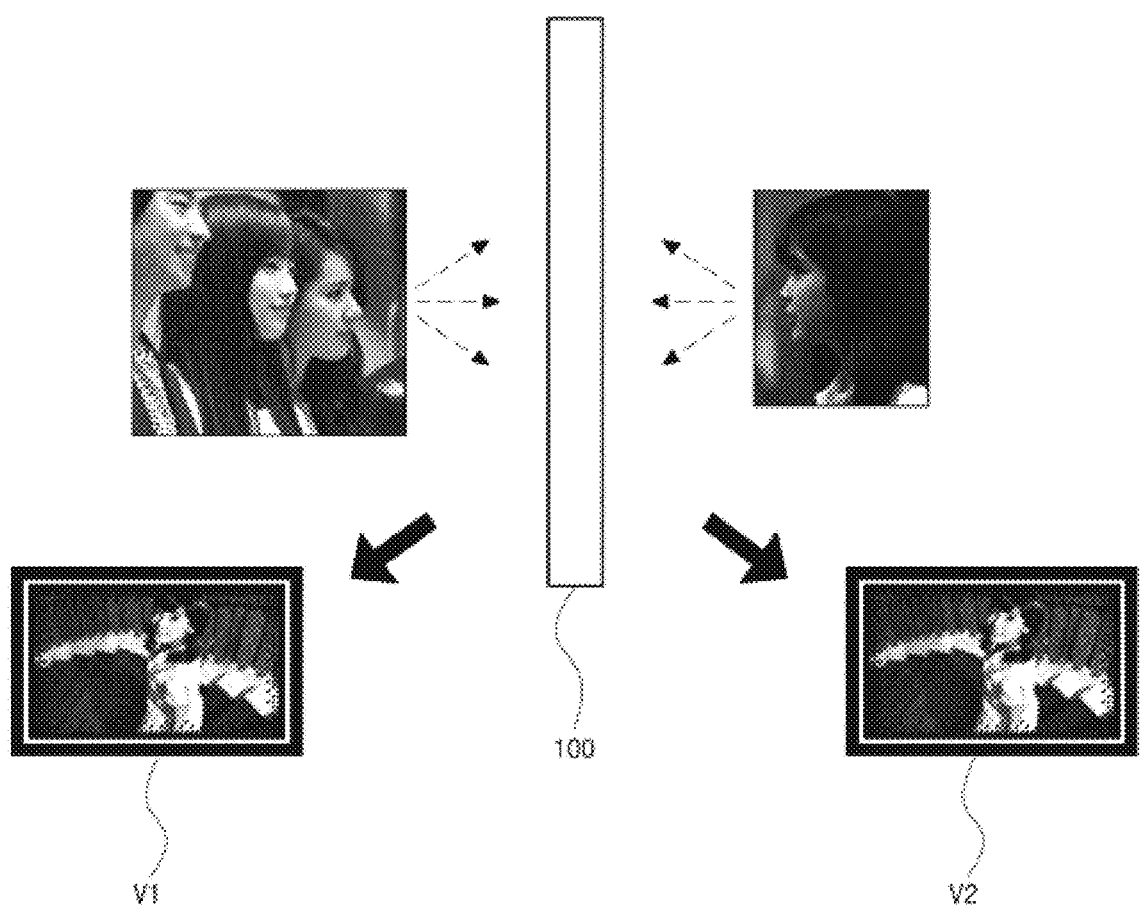
FIG. 1 is a schematic view illustrating a two-way OLED according to an aspect of the present disclosure.

FIG. 1 is a schematic view illustrating a two-way OLED according to an aspect of the present disclosure.

Referring to FIG. 1, the two-way OLED 100 outputs light in a first direction to display a first image V1 of full colors on a first surface of the two-way OLED 100, and outputs light in a second direction, opposite to the first direction, to display a second image V2 of full colors on a second surface of the two-way OLED 100, which is opposite to the first surface.

Accordingly, respective users located in the first direction and the second direction can watch the respective images V1 and V2 through one two-way OLED 100.

The two-way OLED 100 may have the first surface located indoors and the second surface located outdoors to display full color first and second images V1 and V2 in both directions, and thus the images V1 and V2 can be watched indoors and outdoors.

In other words, in this aspect, provided is the two-way OLED 100 that may be divided in two type regions having different emission directions.

Particularly, while displaying the respective full color images V1 and V2 in two ways, the two-way OLED can minimize an error that can be caused in patterning organic light emitting layers (shown as 113 of FIG. 2) in respective sub pixels (shown as R-SP, G-SP and B-SP of FIG. 2), and thus production cost can be reduced and high brightness and low power consumption can be achieved.

This will be explained thereafter with further reference to FIGS. 2 and 3.

Figure 2:
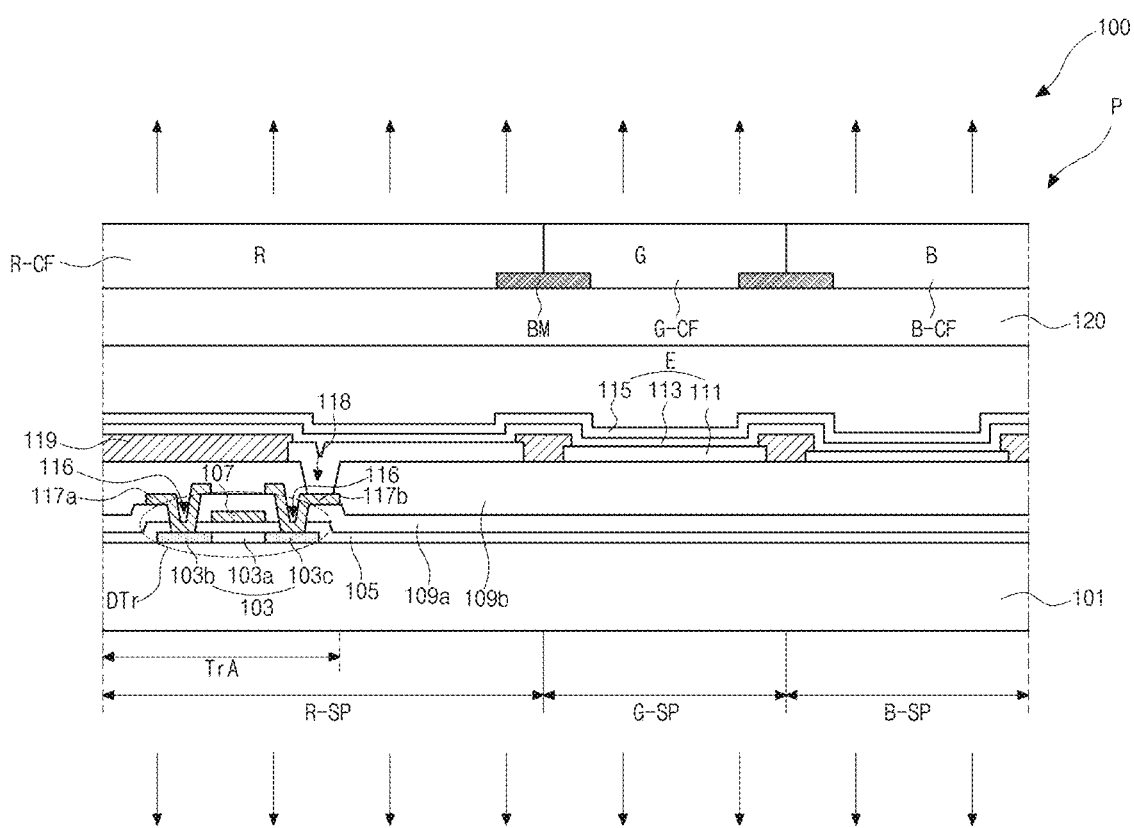
FIG. 2 is a schematic cross-sectional view illustrating a two-way OLED according to an aspect of the present disclosure.

FIG. 2 is a schematic cross-sectional view illustrating a two-way OLED according to an aspect of the present disclosure.

In the two-way OLED 100, a driving thin film transistor (TFT) DTr is located in each of red, green and blue sub pixels R-SP, G-SP and B-SP. In FIG. 2, for the purpose of explanations, the driving TFT DTr is shown at the red sub pixel R-SP only.

The two-way OLED 100 includes an array substrate 101 having the driving TFT DTr and a light emitting diode E thereon, and an encapsulation substrate 120 facing the array substrate 101. The array substrate 101 and the encapsulation substrate 120 are attached to each other to form the two-way OLED 100.

Even though not shown in the drawings, a gate line, a data line and a power line are formed on the substrate 101 to define each of a plurality of sub pixels R-SP, G-SP and B-SP.

The plurality of sub pixels R-SP, G-SP and B-SP includes the red, green and blue sub pixels R-SP, G-SP and B-SP. The neighboring red, green and blue sub pixels R-SP, G-SP and B-SP constitute one unit pixel P.

The red, green and blue sub pixels R-SP, G-SP and B-SP may be arranged alternately in a horizontal direction, or be arranged alternately in a vertical direction.

A semiconductor layer 103 is formed on the substrate 101 in a switching region TrA of each sub pixel. The semiconductor layer 103 may be formed of silicon, and may include an active region 103a as a channel at a center portion thereof, and source and drain regions 103b and 103c, highly doped with impurities, at both sides of the active region 103a.

A gate insulating layer 105 is formed on the semiconductor layer 103.

A gate electrode 107 is formed on the gate insulating layer 103 corresponding to the active region 103a, and the gate line extending along a direction is formed on the gate insulating layer 103.

An inter-layered insulating layer 109a is located on the gate electrode 107 and the gate line. The inter-layered insulating layer 109a and the gate insulating layer 105 include first and second semiconductor contact holes 116 exposing portions of the source and drain regions 103b and 103c, respectively.

Source and drain electrodes 117a and 117b are formed on the inter-layered insulating layer 109a and are spaced apart from each other. The source and drain electrodes 117a and 117b contact portions of the source and drain regions 103b and 103c through the first and second semiconductor contact holes 116, respectively.

A passivation layer 109b is formed on the source and drain electrodes 117a and 117b and the inter-layered insulating layer 109a, and includes a drain contact hole 118 exposing the drain electrode 117b.

The source and drain electrodes 117a and 117b, the semiconductor layer 103, and the gate electrode 107 and the gate insulating layer 105 on the semiconductor layer 103 constitute the driving TFT DTr.

Even though not shown in the drawings, a switching TFT may be connected to the driving TFT DTr and substantially may have the same structure as the driving TFT DTr.

In this aspect of the disclosure, the driving TFT DTr and the switching TFT having a top gate structure with the semiconductor layer 103 formed of a polycrystalline silicon layer or an oxide semiconductor layer is described by way of example. Alternatively, the driving TFT DTr and the switching TFT may have a bottom gate structure with the semiconductor layer 103 formed of an amorphous silicon layer.

When the semiconductor layer 103 uses an oxide semiconductor layer, a light shielding layer may be formed below the semiconductor layer 103, and a buffer layer may be formed between the light shielding layer and the semiconductor layer 103.

An anode layer 111 is formed on the passivation layer 109b and is connected to the drain electrode 117b through the drain contact hole 118. The anode layer 111 may be formed of a material having a relatively high work function.

The anode layer 111 is separately formed in each sub pixel. A bank 119 is formed between adjacent anode layers 111 of neighboring sub pixels.

In other words, the bank 119 may serve as a boundary of each of the sub pixels R-SP, G-SP and B-SP so that the sub pixels R-SP, G-SP and B-SP may be separated from each other by the bank 119.

Figure 3:
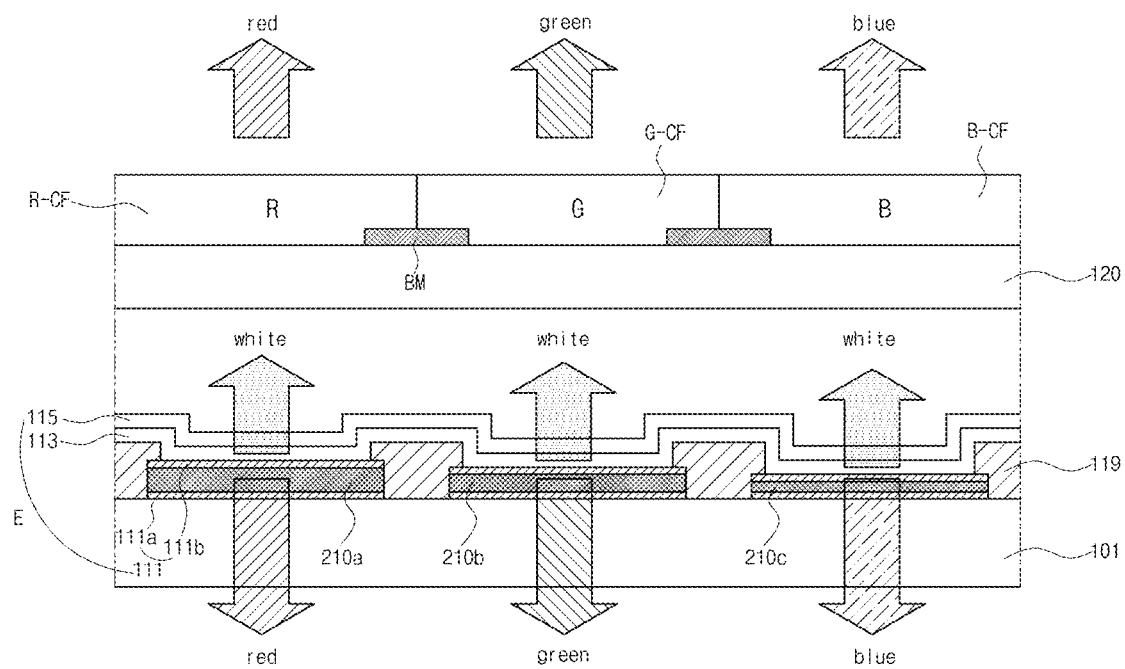
FIG. 3 is a schematic view illustrating a light of a two-way OLED being guided according to an aspect of the present disclosure.

In the OLED 100 of this aspect, the anode layer 111 may include a first electrode (shown as 111a of FIG. 3), a second electrode (111b of FIG. 3), and a color control layer (shown as 210a, 210b or 210c of FIG. 3).

The color control layers (shown as 210a, 210b and 210c of FIG. 3) of the red, green and blue sub pixels R-SP, G-SP and B-PS have different thicknesses, and thus each anode layer 111 having each color control functions as an electrode of the light emitting diode E and as a color filter to convert a color of a light emitted to a first direction as well.

A light emitting layer 113 emitting white light may be formed on the substrate 101 having the anode layer 111 and the bank 119. A cathode layer 115 is formed on the organic light emitting layer 113.

The light emitting layer 113 emits a single color light i.e., white light, and thus the light emitting layer 113 may not be patterned per sub pixel but may be formed entirely over the unit pixel P.

The organic light emitting layer 113 may be formed with a single layer of an emitting material. Alternatively, in order to increase an emission efficiency, the organic light emitting layer 113 may be formed with multiple layers that include a hole injection layer, a hole transport layer, an emitting material layer, an electron transport layer and an electron injection layer.

The hole injection layer, the hole transport layer, the electron transport layer and the electron injection layer may not be patterned per sub pixel but may be formed entirely over the unit pixel P.

Accordingly, compared with the conventional art including organic light emitting layers patterned separately in red, green and blue sub pixels and emitting red, green and blue, respectively, patterning processes using shadow masks can be reduced by one to five times, and thus a pattering error can be minimized and also a defect rate can be minimized.

The cathode layer 115 may be formed of a material having a relatively low work function. The cathode 115 may be formed with a single layer or multiple layers using a first metal of a low work function such as Ag and a second metal such as Mg, and the single layer may be formed of an alloy of the first and second metals at a predetermined ratio thereof.

A capping layer may be formed on the cathode layer 115.

The encapsulation substrate 120 is located on the driving TFT DTr and the light emitting diode E, and the OLED 100 is encapsulated by the encapsulation substrate 120.

The encapsulation substrate 120 may use at least two inorganic protection films in order to prevent external oxygen or moisture permeating the OLED 100. In this case, an organic protection film may be interposed between two inorganic protection films in order to complement a shock resistance of the inorganic protection films.

For the stack structure of the organic protection film and the inorganic protection film being formed alternately, since it is required to prevent permeation of oxygen or moisture through a side surface of the organic protection film, the inorganic protection films may fully enclose the organic protection film.

Thus, permeation of oxygen or moisture into the OLED 100 can be prevented.

The encapsulation substrate 120 may be formed in a thin film type and may be adhered on or deposited on the driving TFT DTr and the light emitting diode E. Alternatively, the encapsulation substrate 120 may be formed as a thin substrate type and may be attached with the array substrate 101 while being spaced apart from the array substrate 101. In this aspect, color filters R-CF, G-CF and B-CF are located on the encapsulation substrate 120. The color filters R-CF, G-CF and B-CF function to convert white light from the organic light emitting layer 113 into respective color lights, and the red, green and blue color filters R-CF, G-CF and B-CF are located at the red, green and blue sub pixels R-SP, G-SP and B-SP. A black matrix BM is located between the red, green and blue color filters R-CF, G-CF and B-CF.

The black matrix BM serves to prevent a color mixture at boundaries between the red, green and blue sub pixels R-SP, G-SP and B-SP. The black matrix BM may be formed of chromium (Cr) or other opaque metal, and alternatively, be formed of resin.

In the OLED 100 of this aspect, when the anode layer 111 and the cathode layer 115 are applied with respective voltages, a hole from the anode layer 111 and an electron from the cathode layer 115 are transported to the organic light emitting layer 113 and form an exciton, and when a transition of the exciton from the excited state to the ground state happens, light is generated and emitted.

The OLED 100 is a two-way emission type display device in which the light from the organic light emitting layer 113 is output to the outside through both of the anode layer 111 and the cathode layer 115, and in this case, light in a first direction penetrating the anode layer 111 is converted into red, green or blue light by the first and second electrodes 111a and 111b and the corresponding color control layer (shown as 210a, 210b or 210c of FIG. 3) at the red, green or blue sub pixel R-SP, G-SP and B-SP.

After light in a second direction opposite to the first direction penetrates the cathode 115 and the encapsulation substrate 120 sequentially, and while penetrating the red, green or blue color filter R-CF, G-CF or B-CF, it is converted into red, green or blue light at the red, green or blue sub pixel R-SP, G-SP and B-SP.

Accordingly, the two-way OLED 100 displays the full color first image at the first surface on the first direction and the full color second image at the second surface on the second direction.

Therefore, respective users located in the opposite directions can watch the respective desired images through one two-way OLED 100.

FIG. 3 is a schematic view illustrating light of a two-way OLED being guided according to an aspect of the present disclosure.

Referring to FIG. 3, the red, green and blue sub pixels R-SP, G-SP and B-SP are defined on the substrate 101. In each of the red, green and blue sub pixels R-SP, G-SP and B-SP, the light emitting diode E including the anode layer 111, the organic light emitting layer 113 and the cathode layer 115 is located.

The anodes layer 111 of the neighboring sub pixels are separated from each other with the bank 119 therebetween. The organic light emitting layer 113 and the cathode layer 115 is not be separated by the sub pixel but is formed over the entire surface of the unit pixel P.

The anode layers 111 of the red, green and blue sub pixels R-SP, G-SP and B-SP include the respective first and second electrodes 111a and 111b, and the respective color control layers 210a, 210b or 210c between the first and second electrodes 111a and 111b.

The encapsulation substrate 120 is located on the light emitting diode E. The red, green and blue color filters R-CF, G-CF and B-CF and the black matrix BM are located on the encapsulation substrate 120.

In detail, the black matrix BM are located along edges of each of the red, green and blue sub pixels R-SP, G-SP and B-SP. Accordingly, the black matrix BM is spaced apart from its neighboring black matrix BM, and an opening corresponding to each sub pixel is formed between the neighboring black matrixes BM.

The red, green and blue color filters R-CF, G-CF and B-CF are located at the respective openings. The red color filter R-CF is located at the opening corresponding to the red sub pixel R-SP, the green color filter G-CF is located at the opening corresponding to the green sub pixel R-SP, and the blue color filter B-CF is located at the opening corresponding to the blue sub pixel B-SP.

For the two-way OLED 100, when white light is emitted from the organic light emitting layer 113, the white light is emitted radially thus penetrates both of the anode layer 111 and the cathode layer 115.

While the white light to the anode layer 111 penetrates the anode layer 111, the white light is converted into red, green and blue light at the red, green and blue sub pixels R-SP, G-SP and B-SP.

In detail, the anode layer 111 includes the first and second electrodes 111a and 111b, and the color control layer 210a, 210b or 210c of the corresponding sub pixel, and each of the first and second electrodes 111a and 111b are formed of a metal material at a very thin thickness.

For example, the first electrode 111a may have a thickness of hundreds of angstroms or less and may be formed of Ag, Ti, Al, Au, Mo, an alloy of Ag and Mg or the like. The second electrode 111b may be formed of the same material as the first electrode 111a, and may have the same thickness as the first electrode 111a.

When the first and second electrodes 111a and 111b have the same thickness, a light transmission efficiency for a light of a specific wavelength band may increase.

Accordingly, even though the first and second electrodes 111a and 111b are formed of a metal material being opaque and high reflective, when each of the first and second electrodes 111a and 111b have a thickness of hundreds of angstroms or less, the first and second electrodes 111a and 111b of the anode 111 each become substantially optically transparent.

The color control layer 210a, 210b or 210c between the first and second electrodes 111a and 111b may be formed of an organic material, nitride material, or oxide material. The color control layer 210a, 210b or 210c may be formed of a transparent material to transmit white light emitted from the organic light emitting layer 113. For example, when the color control layer 210a, 210b or 210c is formed of an organic material, the organic material may be polyimide, photo acryl, benzocyclobutene (BCB) or the like.

When the color control layer 210a, 210b or 210c is formed of a nitride material, the nitride material may be silicon nitride (SiNx) or the like. When the color control layer 210a, 210b or 210c is formed of an oxide material, the oxide material may be molybdenum oxide ($MoO_3$), silicon oxide ($SiO_2$), indium zinc oxide (IZO), indium tin oxide (ITO), indium tin zinc oxide (ITZO) or the like.

Since each anode layer 111 may include the first and second electrodes 111a and 111b and each color control layer 210a, 210b or 210c between the first and second electrodes 111a and 111b, and the color control layers 210a, 210b are 210c have different thicknesses for the respective sub pixels R-SP, G-SP and B-SP, lights penetrating the respective anodes 111 have respective specific color wavelengths, and colors of desired wavelengths can be achieved.

In other words, in this aspect, by locating the color control layers 210a, 210b and 210c having different thicknesses at the respective sub pixels R-SP, G-SP and B-SP, the red, green and blue sub pixels R-SP, G-PS and B-SP can emit the red, green and blue light, respectively.

Figure 4:
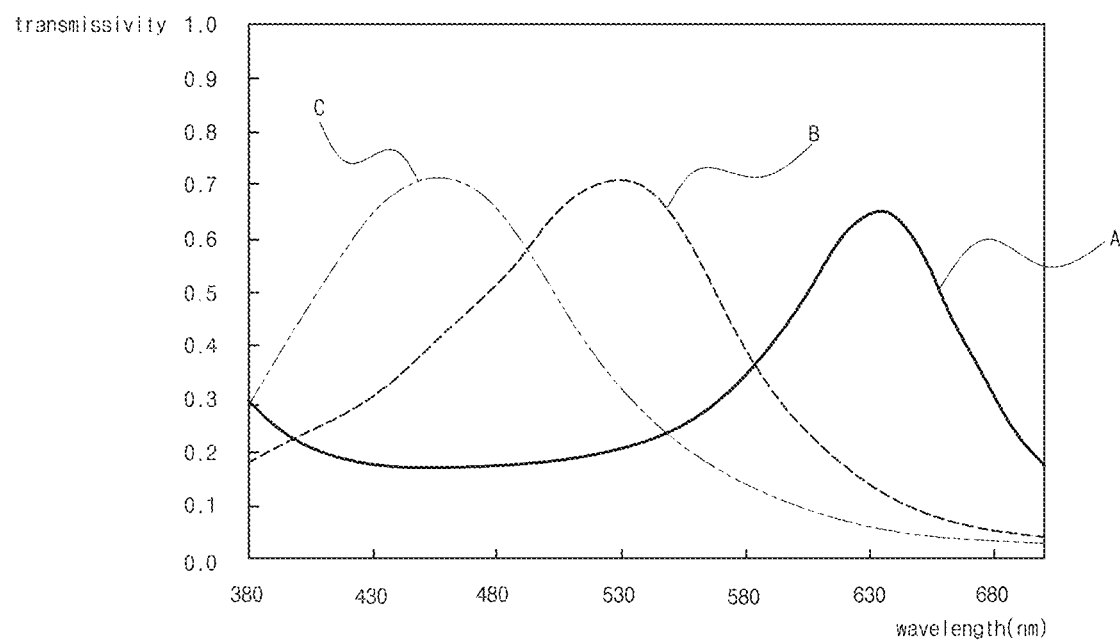
FIG. 4 is a graph illustrating experimental results of light transmission wavelength bands according to thicknesses of color control layers according to an aspect of the present disclosure.

FIG. 4 is a graph illustrating experimental results of light transmission wavelength bands according to thicknesses of color control layers according to an aspect of the present disclosure. In FIG. 4, an x axis indicates a wavelength of transmitted light and a y axis indicates a transmissivity of an incident light.

A light penetrating a color control layer of a thickness, 1200 angstroms is indicated by 'A', a light penetrating a color control layer of a thickness, 900 angstroms is indicated by 'B', and a light penetrating a color control layer of a thickness, 700 angstroms is indicated by 'C'.

Referring to FIG. 4, when a thickness of a color control layer is 1200 angstroms, a transmitted light has a peak at a wavelength of 630 nm to display red. When a thickness of a color control layer is 900 angstroms, a transmitted light has a peak at a wavelength of 530 nm to display green. When a thickness of a color control layer is 700 angstroms, a transmitted light has a peak at a wavelength of 450 nm to display a blue.

According to these results, in the two-way OLED 100, since each anode layer 111 includes the first and second electrodes 111a and 111b and each color control layer 210a, 210b or 210c that is between the first and second electrodes 111a and 111b and that is different in thickness for each of the sub pixels R-SP, G-SP and B-SP, white light emitted in a first direction from the organic light emitting layer 113 is converted into red, green or blue light for the corresponding sub pixel while penetrating the corresponding anode 111.

In other words, in the red sub pixel R-SP, the color control layer 210a (or a first color control layer) of a first thickness to emit a red is interposed between the first and second electrodes 110a and 110b. In the green sub pixel G-SP, the color control layer 210b (or a second color control layer) of a second thickness, less than the first thickness, to emit a green is interposed between the first and second electrodes 110a and 110b. In the blue sub pixel B-SP, the color control layer 210c (or a third color control layer) of a third thickness, less than the second thickness, to emit a blue is interposed between the first and second electrodes 110a and 110b.

Accordingly, white light in the first direction from the organic light emitting layer 113 is converted into red light at the red sub pixel R-SP while penetrating the anode layer 111 of the red sub pixel R-SP. The white light in the first direction from the organic light emitting layer 113 is converted into green light at the green sub pixel G-SP while penetrating the anode layer 111 of the green sub pixel G-SP. The white light in the first direction from the organic light emitting layer 113 is converted into blue light at the blue sub pixel B-SP while penetrating the anode 111 layer of the blue sub pixel B-SP.

Thus, the two-way OLED 100 of this aspect outputs red, green and blue light in the first direction without respective color filters and thus can display a full color image.

Each of the red, green and blue light through each anode layer 111 increases a light extraction efficiency by a micro cavity formed between the first and second electrodes 111a and 111b.

Further, white light emitted in a second direction from the organic light emitting layer 113 is converted into a red, green or blue light at the red, green and blue sub pixel R-SP, G-SP or B-SP while penetrating the red, green and blue color filter R-CF, G-CF or B-CF on the encapsulation substrate 120.

Thus, the two-way OLED 100 of this aspect outputs red, green and blue light in the second direction and thus can display a full color image.

As described above, since the anode layer 111 includes the first and second electrodes 111a and 111b and the corresponding color control layer 210a, 210b or 210c that is between the first and second electrodes 111a and 111b and that is different in thickness for the corresponding sub pixel R-SP, G-SP or B-SP, the two-way OLED 100 outputs red, green and blue light in the first direction without respective color filters and thus can display a full color image.

Further, since the red, green or blue color filters R-CF, G-CF and B-CF is located on the second direction at the red, green or blue sub pixel R-SP, G-SP or B-SP, the two-way OLED 100 display a full color image in the second direction.

In this aspect, the organic light emitting layer 113 is formed without processes of patterning by each sub pixel, an error caused by the patterning processes can be minimized, and thus a production efficiency can be improved. Further, since the organic light emitting layer 113 emitting white light can achieve a high brightness and a low power consumption compared with an organic light emitting layer emitting a red, green or blue light at a red, green or blue sub pixel, the two-way OLED 100 having a high brightness and a low power consumption can be provided.

The anode layer 111 has a very thin thickness in order to improve a transmission efficiency and serve as a color filter.

In this regard, as the anode layer 111 is thinner, its resistance is greater. Particularly, for a large-sized OLED, as a resistance of the anode layer 111 increases, a voltage drop at a location far from a power source increases. Thus, the current supplied all over the organic light emitting layer 113 is not uniform, a brightness becomes non-uniform.

In this aspect, to prevent the voltage drop of the anode layer 111, the first and second electrodes 111a and 111b may be electrically connected to each other. In other words, the first and second electrodes 111a and 111b may be connected to each other at both side surfaces of the corresponding color control layer 210a, 210b or 210c. Accordingly, a resistance of the anode layer 111 can be reduced.

The red, green and blue sub pixels R-SP, G-SP and B-SP have the respective color control layers 210a, 210b and 210c different in thickness thus have the respective anodes 111 different in thickness. Accordingly, distances between the anodes layer 111 of the red, green and blue sub pixels R-SP, G-SP and B-SP and the red, green and blue color filters R-CF, G-CF and B-CF are different from each other.

In other words, when a first distance at the red sub pixel R-SP is defined between the second electrode 111b of the anode layer 111 and the red color filter R-CF, a second distance between the second electrode 111b of the anode layer 111 and the green color filter G-CF at the green sub pixel G-SP is greater than the first distance, and a third distance between the second electrode 111b of the anode layer 111 and the blue color filter B-CF at the blue sub pixel B-SP is greater than the second distance.

Thus, the distance between each second electrode 111b and each color filter is in inverse proportion to a thickness of each anode layer 111.

The configuration that the unit pixel P includes the red, green and blue sub pixels R-SP, G-SP and B-SP is explained above by way of example. Alternatively, the unit pixel may further include a white sub pixel, and in this case, the white sub pixel may have a white color filter or configured such that white light from the organic light emitting layer 113 is directly output without a white color filter.

Particularly, in the white sub pixel, the anode layer 111 may only have a first electrode 111a, and thus white light from the organic light emitting layer 113 is intactly transmitted in both of the first direction and the second direction.

It will be apparent to those skilled in the art that various modifications and variations can be made in a display device of the present disclosure without departing from the sprit or scope of the disclosure. Thus, it is intended that the present disclosure covers the modifications and variations of this disclosure provided they come within the scope of the appended claims and their equivalents.

What is claimed is:

1. A two way organic light emitting diode display device including red, green and blue sub-pixels defined at an array substrate, comprising:
    a plurality of driving thin film transistors each driving corresponding each of the red, green and blue sub-pixels;
    an organic light emitting diode disposed at each sub-pixel and including an anode layer electrically connected to each thin film transistor at the red, green and blue sub-pixels, an organic light emitting layer disposed on the anode layer and emitting white light, and a cathode layer disposed on the organic light emitting layer;
    an encapsulating substrate encapsulating the plurality of driving thin film transistors and the organic light emitting diode; and
    red, green and blue color filters corresponding to each of the red, green and blue sub-pixels and disposed on the encapsulating substrate,
    wherein the anode layer includes a first electrode, a first color control layer corresponding to the red sub-pixel and disposed on the first electrode, a second color control layer corresponding to the green sub-pixel and disposed on the first electrode, a third color control layer corresponding to the blue sub-pixel and disposed on the first electrode, a second electrode disposed on the first, second and third color control layers,
wherein the white light passes through the anode layer and is converted to red, green and blue light in a first direction and passes through the red, green and blue color filters and is converted to red, green and blue light in a second direction, opposite to the first direction.

2. The device according to claim 1, wherein the first, second and third color control layers have different thicknesses.

3. The device according to claim 2, wherein the first color control layer of the red sub-pixel has a first thickness, the second color control layer of the green sub-pixel has a second thickness, and the third color control layer of the blue sub-pixel has a third thickness,
wherein the first thickness is greater than the second thickness, and the second thickness is greater than the third thickness.

4. The device according to claim 1, wherein the first electrode and the second electrode have a same thickness.

5. The device according to claim 1, wherein the first electrode and the second electrode are electrically connected with each other.

6. The device according to claim 1, further comprising a black matrix disposed at each boundary among the red, green and blue color filters.

7. The device according to claim 1, further comprising a white sub-pixel disposed at the array substrate and having only the first electrode of the anode layer, wherein the organic light emitting layer and the cathode layer are disposed on the first electrode.

8. The device according to claim 7, further comprising a white color filter corresponding to the white sub-pixel disposed on the encapsulating substrate.

9. The device according to claim 8, wherein the organic light emitting layer emits the white light in both the first direction and the second direction.

10. The device according to claim 1, wherein each second electrode and each color filter are separated by a distance that is inversely proportional to a thickness of each anode layer at each sub-pixel.

11. The device according to claim 10, wherein the second electrode of the red sub-pixel and the red color filter are separated by a first distance, the second electrode of the green sub-pixel and the green color filter are separated by a second distance, and the second electrode of the blue sub-pixel and the blue color filter are separated by a third distance,
wherein the first distance is shorter than the second distance, and the second distance is shorter than the third distance.

12. The device according to claim 10, wherein the plurality of driving thin film transistors further comprises a semiconductor layer, a gate insulating layer on the semiconductor layer, a gate electrode on the gate insulating layer, a first inter-layered insulating layer on the gate electrode, and source and drain electrodes on the first inter-layered insulating layer.

13. A two way organic light emitting diode display device including first and second sub-pixels defined at an array substrate, comprising:
an anode layer disposed at each sub-pixel and electrically connected to each thin film transistor, wherein each anode layer at each sub-pixel includes,
a first electrode,
a first color control layer corresponding to the first sub-pixel and disposed on the first electrode, a second color control layer corresponding to the second sub-pixel and disposed on the first electrode,
a second electrode electrically connected to the first electrode and disposed on the first and second color control layers, wherein the first and second color control layers have different thicknesses;
an organic light emitting layer disposed on the anode layer and emitting third color light;
a cathode layer disposed on the organic light emitting layer; and
first and second color filters corresponding to each of the first and second sub-pixels,
wherein the third color light passes through the anode layer and is converted to first and second color light in a first direction and passes through the first and second color filters and is converted to fourth and fifth color light in a second direction, opposite to the first direction.

14. The device according to claim 13, wherein the organic light emitting layer emits the third color light in both the first direction and the second direction, wherein the third color light is white light.

15. The device according to claim 13, wherein the first and fourth color light have a same color and a same wavelength and the second and fifth color light have a same color and a same wavelength.

16. The device according to claim 13, wherein the first color control layer of the first sub-pixel has a first thickness, the second color control layer of the second sub-pixel has a second thickness, wherein the first thickness is greater than the second thickness.

17. The device according to claim 13, wherein the second electrode of the first sub-pixel and the first color filter are separated by a first distance, the second electrode of the second sub-pixel and the second color filter are separated by a second distance, wherein the first distance is greater than the second distance and the fourth color light has a wavelength greater than the fifth color light.

18. The device according to claim 13, wherein the first and second electrodes have a same thickness.

19. The device according to claim 13, wherein the second electrode of the first sub-pixel and the first color filter are separated by a first distance, and the second electrode of the second sub-pixel and the second color filter are separated by a second distance, wherein the first distance is greater than the second distance and the fourth color light has a wavelength greater than the fifth color light.

20. A two way organic light emitting display device having first and second organic light emitting diodes at corresponding first and second sub-pixels, comprising:
an anode layer disposed at each sub-pixel and each including a first electrode, a first color control layer corresponding to the first sub-pixel and disposed on the first electrode, a second color control layer corresponding to the second sub-pixel and disposed on the first electrode, and a second electrode electrically connected to the first electrode and disposed on the first and second color control layers,
an organic light emitting layer disposed on the anode layer and emitting third color light; and
a cathode layer disposed on the organic light emitting layer,
wherein the third color light passes through the first and second color control layers each having different thicknesses and the anode layer and is converted to first and second color light in a first direction and concurrently passes through the first and second color filters and is converted to fourth and fifth color light in a second direction, opposite to the first direction.

\* \* \* \* \*